United States Patent
Chen et al.

(10) Patent No.: US 11,721,573 B2
(45) Date of Patent: Aug. 8, 2023

(54) METHOD AND APPARATUS FOR DETECTING POSITIONS OF WAFERS

(71) Applicant: HIWIN TECHNOLOGIES CORP., Taichung (TW)

(72) Inventors: Yan-Yu Chen, Taichung (TW); Ming-Shiou Liu, Taichung (TW)

(73) Assignee: Hiwin Technologies Corp., Taichung (TW)

( * ) Notice: Subject to any disclaimer, the term of this patent is extended or adjusted under 35 U.S.C. 154(b) by 137 days.

(21) Appl. No.: 17/302,437

(22) Filed: May 3, 2021

(65) Prior Publication Data
US 2022/0059382 A1   Feb. 24, 2022

(30) Foreign Application Priority Data
Aug. 21, 2020   (TW) .................................. 109128544

(51) Int. Cl.
| | | |
|---|---|---|
| *H01L 21/68* | (2006.01) | |
| *G01B 11/26* | (2006.01) | |
| *G01B 11/24* | (2006.01) | |

(52) U.S. Cl.
CPC ............ *H01L 21/681* (2013.01); *G01B 11/24* (2013.01); *G01B 11/26* (2013.01)

(58) Field of Classification Search
CPC ............. H01L 21/681; H01L 21/67259; H01L 21/68714; G01B 11/24; G01B 11/26; G01B 11/002; G01B 11/272
See application file for complete search history.

(56) References Cited

U.S. PATENT DOCUMENTS

| | | | |
|---|---|---|---|
| 2006/0169208 A1* | 8/2006 | Shinozaki | ......... H01L 21/67017 118/715 |
| 2015/0198899 A1* | 7/2015 | Fukushi | ................ H01L 21/681 355/73 |

FOREIGN PATENT DOCUMENTS

| | | | |
|---|---|---|---|
| JP | 2729297 B2 | 3/1998 | |
| JP | 3223584 B2 | 10/2001 | |
| JP | 4226241 B2 | 2/2009 | |
| WO | WO-2008153086 A1 * | 12/2008 | ....... H01L 21/67265 |

* cited by examiner

*Primary Examiner* — Catherine T. Rastovski
*Assistant Examiner* — Yossef Korang-Beheshti
(74) *Attorney, Agent, or Firm* — Wang Law Firm, Inc.

(57) ABSTRACT

A method for detecting positions of wafers includes: rotating a rotation table with a wafer thereon in a first direction at a first speed; detecting a contour of the wafer rotating in the first direction at the first speed to provide contour data; rotating the rotation table in a second direction at a second speed when an aiming feature of the wafer passes the detector in the first direction at the first speed; detecting the contour of the wafer rotating in the second direction at the second speed to provide new contour data; and stopping the rotation of the rotation table and the detection of the wafer according to an accumulation of contour data and corresponding rotation angles, to estimate an eccentric position of the wafer and a position of the aiming feature when the aiming feature passes the detector in the second direction at the second speed.

12 Claims, 16 Drawing Sheets

METHOD AND APPARATUS FOR DETECTING POSITIONS OF WAFERS

BACKGROUND

Field of the Invention

The present invention relates to a wafer alignment apparatus, and more particularly to a method and an apparatus for detecting positions of wafers.

Related Prior Art

Generally, before a wafer enters a semiconductor manufacturing apparatus, a wafer aligner is used for eccentricity correction, that is, the wafer is placed on a rotation table of the wafer aligner, and an aiming procedure is performed to align the center of the wafer with the center of rotation of the rotation table.

Japanese grant patent No. 2729297 discloses an apparatus for centering a semiconductor wafer. The apparatus includes a rotation table for holding the wafer, and a detector composed of a light projector and a light receiver. This apparatus drives, by a driving device, the rotation table, on which the wafer is placed, to rotate one cycle at a faster speed, and controls the detector to roughly detect the change in the outer contour of the wafer in a non-contact manner while the wafer is rotating, so as to find out the location of the notch on the outer contour of the wafer. Then, the rotation table is driven to rotate so that the notch of the outer contour returns to the edge of the detection area of the detector, and then the rotation table is driven to rotate at a lower speed while the detector detects the change in the contour of the notch in detail. Finally, the apparatus calculates the eccentric quantity, the eccentric direction, and the orientation of the center of the notch based on the accumulated detection results.

Japanese grant patent No. 3223584 discloses an apparatus and method for centering a semiconductor wafer. First, this apparatus drives the rotation table to rotate one round and controls the detector to detect the periphery of the wafer placed on the rotation table. Then, the rotation table is driven to rotate by 0 degrees, 90 degrees, 180 degrees, and 270 degrees in sequence while the detector is controlled to detect the periphery of the wafer. Finally, according to the accumulated detection results, the eccentric quantity, the eccentric direction, and the orientation of the notch center are calculated.

Japanese grant patent No. 4226241 discloses a device and method of wafer positioning. Similarly, the wafer positioning apparatus also drives the rotation table to rotate 360 degrees, and controls the line sensor to detect the periphery of the wafer placed on the rotation table. Then, according to the detection result of the line sensor and the rotation angle of the rotation table, the degree of deviation of the center of the wafer from the rotation center of the rotating table and the orientation of the notch are calculated.

However, these existing methods of detecting the position deviation of the wafer all need to detect the complete periphery of the wafer to calculate the degree of deviation of the center of the wafer from the rotation center of the rotation table and the orientation of the notch, so it is quite time-consuming and is unfavorable for batches of wafers to undergo subsequent processes.

SUMMARY

One objective of the present invention is to provide a method and an apparatus for detecting positions of wafers by detecting a part of the periphery (particularly, the contour (or outline)) of the wafer to know the eccentric position of the wafer.

According to one embodiment of the invention, a method for detecting positions of wafers includes the following steps: placing the wafer on a rotating table, and a contour of the wafer including an aiming feature; driving, by a controller, the rotation table to rotate in a first direction at a first speed, so as to drive the wafer to rotate in the first direction at the first speed; detecting, by a detector, the contour of the wafer rotating in the first direction at the first speed to provide a piece of contour data, corresponding to a respective currently-detected position on the contour, to the controller; when the controller, according to the piece of contour data corresponding to rotation of the rotation table in the first direction at the first speed, determines that the aiming feature passes the detector in the first direction at the first speed, by the controller, driving the rotation table to rotate in a second direction at a second speed to drive the wafer to rotate in the second direction at the second rotation speed, and the second direction being opposite to the first direction; detecting, by the detector, the contour of the wafer rotating in the second direction at the second speed to provide a piece of contour data, corresponding to a respective currently-detected position on the contour, to the controller; and when the controller, according to the piece of contour data corresponding to rotation of the wafer in the second direction at the second speed, determines that the aiming feature passes the detector in the second direction at the second speed, by the controller, stopping rotation of the rotation table and detection of the wafer to according to an accumulation of contour data and rotation angles corresponding to all the detected positions on the contour, estimate an eccentric position of the wafer and a position of the aiming feature. Optionally, the respective piece of contour data is related to a distance from a rotation center of the rotation table to corresponding one of the detected positions on the contour. Optionally, in the method, a first angle, by which the rotation table rotates in the first direction at the first speed, and a second angle, by which the rotation table rotates in the second direction at the second speed, are larger than 0 degree but less than 360 degrees. Optionally, in the method, estimating the eccentric position of the wafer according to the accumulation of contour data and the rotation angles corresponding to all the detected positions on the contour includes the following steps: mapping a respective piece of contour data among the accumulation of contour data and the corresponding rotation angle into a respective piece of two-dimensional information; simulating a circular curve corresponding to all the detected positions on the contour of the wafer according all the pieces of two-dimensional information; and estimating a center of the circular curve as the eccentric position of the wafer. Optionally, in the method, estimating the position of the aiming feature according to the accumulation of contour data and the rotation angles corresponding to all the detected positions on the contour includes the following steps: defining, by the controller, a minimum piece of contour data among the accumulation of contour data as contour data of a pole of the aiming feature; and estimating, by the controller, the position of the aiming feature according to a position of the center of the circular curve and a position of the pole. Optionally, in the method, the controller calculates a respective instantaneous variation value by calculating a differential of the respective piece of contour data, and when the controller determines that the instantaneous variation value is greater than or equal to a measurement threshold, the controller determines that the aiming feature passes the detector. Optionally, the method further includes the following steps: estimating, by the controller, a total measured angle of the wafer according to the accumulation of contour data and the rotation angles corresponding to all the detected positions on the contour, and the total measured angle being an angle corresponding to a detected range on the contour of the wafer; determining, by the controller, whether the total measured angle is greater than or equal to a first angle threshold; and estimating a deviation of a center of the wafer and an angular deviation of the aiming feature according to the accumulation of contour data and the rotation angles corresponding to all the detected positions on the contour by the controller after the rotation of the rotation table and the detection of the wafer are stopped, wherein when the controller, according to the contour data, determines that the aiming feature passes the detector in the second direction and the total measured angle is greater than or equal to the first angle threshold, the controller stops the rotation of the rotation table and the detection of the wafer. Optionally, the method further includes the following step: executing, by the controller, a first compensation scheme when the total measured angle is less than the first angle threshold, and the first compensation scheme including the following steps: driving, by the controller, the rotation table to rotate in the first direction at the first speed again, so as to drive the wafer to rotate in the first direction at the first speed again; detecting, by the detector, the contour of the wafer rotating in the first direction at the first speed again to provide a new piece of contour data, corresponding to a respective currently-detected position on the contour, to the controller; and updating, by the controller, the total measured angle according to the accumulation of contour data and the rotation angles corresponding to all the detected positions on the contour to determine whether the updated total measured angle is greater than or equal to the first angle threshold. Optionally, the method further includes the following step: executing, by the controller, a second compensation scheme when the total measured angle is less than the first angle threshold, and the second compensation scheme including the following steps: driving, by the controller, the rotation table to rotate in the second direction at the first speed, so as to drive the wafer to rotate in the second direction at the first speed; detecting, by the detector, the contour of the wafer rotating in the second direction at the first speed to provide a new piece of contour data, corresponding to a respective currently-detected position on the contour, to the controller; and updating, by the controller, the total measured angle according to the accumulation of contour data and the rotation angles corresponding to all the detected positions on the contour to determine whether the updated total measured angle is greater than or equal to the first angle threshold. Optionally, the method further includes the following steps: when the total measured angle is less than the first angle threshold, estimating, by the controller, time periods, required to execute compensation schemes respectively, according to the total measured angle and the first angle threshold, and the compensation schemes are related to a rotation direction and a speed of the rotating table; and by the controller, deciding to execute one of the compensation schemes according to the time periods to increase the detected range on the contour of the wafer, and then updating the total measured angle, so as to determine whether the updated total measured angle is greater than or equal to the first angle threshold.

According to one embodiment of the invention, an apparatus for detecting positions of wafers includes: a rotation table for carrying the wafer, and a contour of the wafer including an aiming feature; a detector arranged near the rotating table; and a controller electrically connected to the rotation table and the detector and configured for executing the method for detecting the positions of the wafers mentioned above.

In this way, the method for detecting positions of wafers and apparatus using this method provided by the present invention only need to detect a part of the periphery of the wafer to obtain a detection result within an acceptable error range. Therefore, the time required for detection can be greatly reduced

BRIEF DESCRIPTION OF THE DRAWINGS

After studying the detailed description in conjunction with the following drawings, other aspects and advantages of the present invention will be discovered.

DETAILED DESCRIPTION

In the following detailed description, many specific details are explained in order to provide a thorough understanding of the present invention. However, those of ordinary skill in the art will understand that the present invention can be practiced without these specific details. In other cases, well-known methods, procedures and/or elements have not been described in detail so as not to obscure the present invention.

Figure 1:
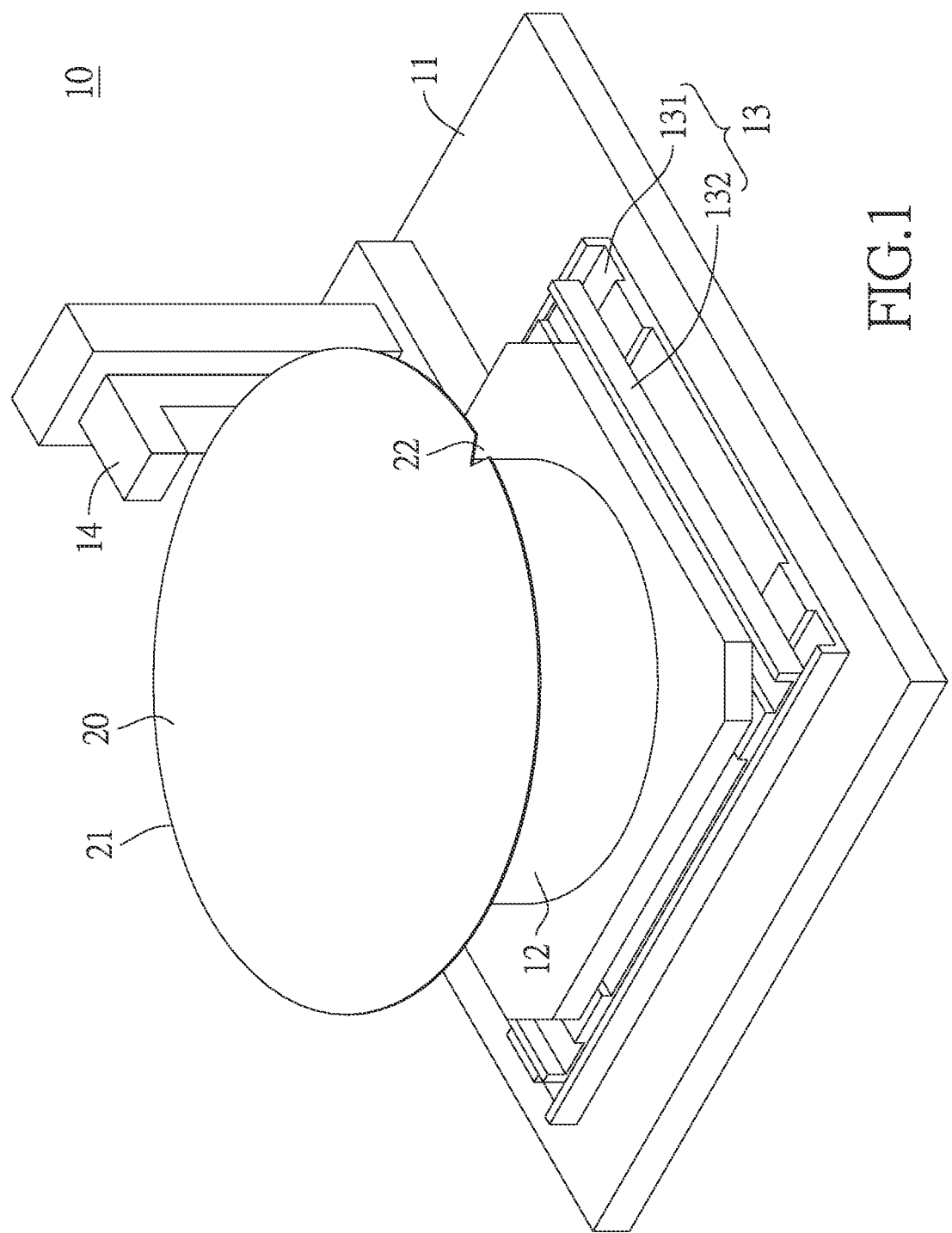
FIG. 1 is a schematic diagram of a system for detecting positions of wafers according to an embodiment of the present invention.
Figure 2:
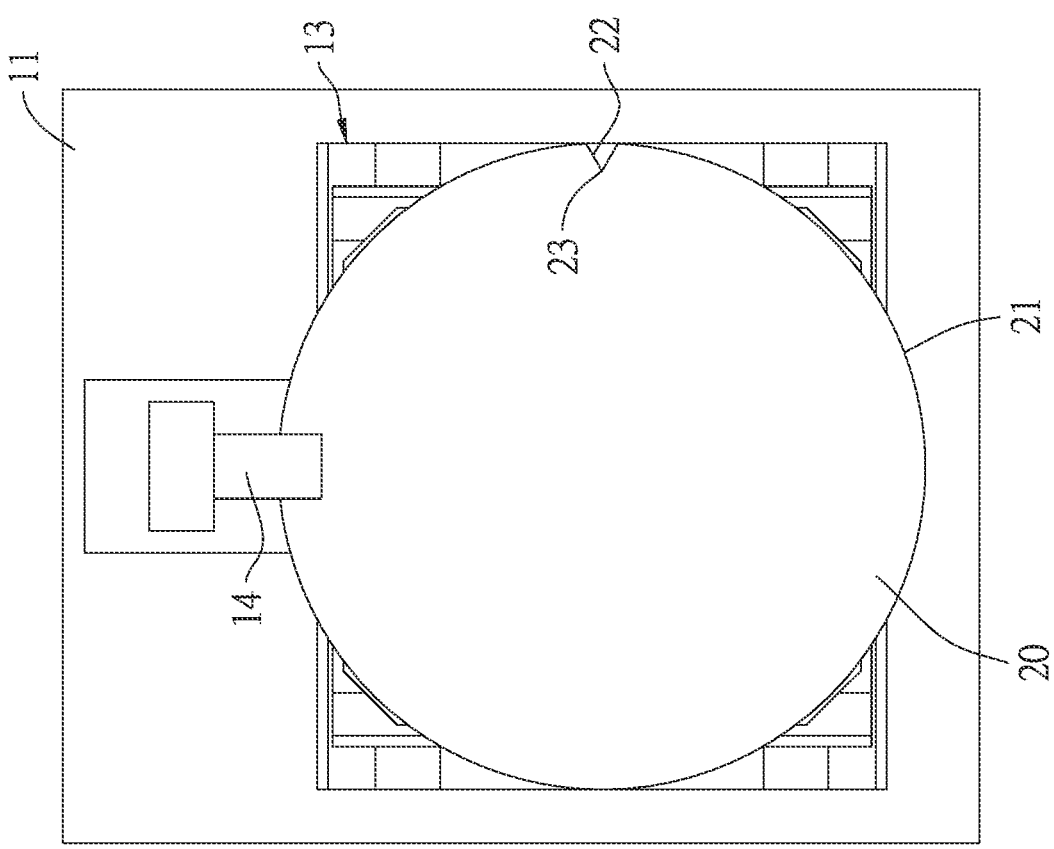
FIG. 2 is a top view of the system for detecting positions of wafers in FIG. 1.
Figure 3:
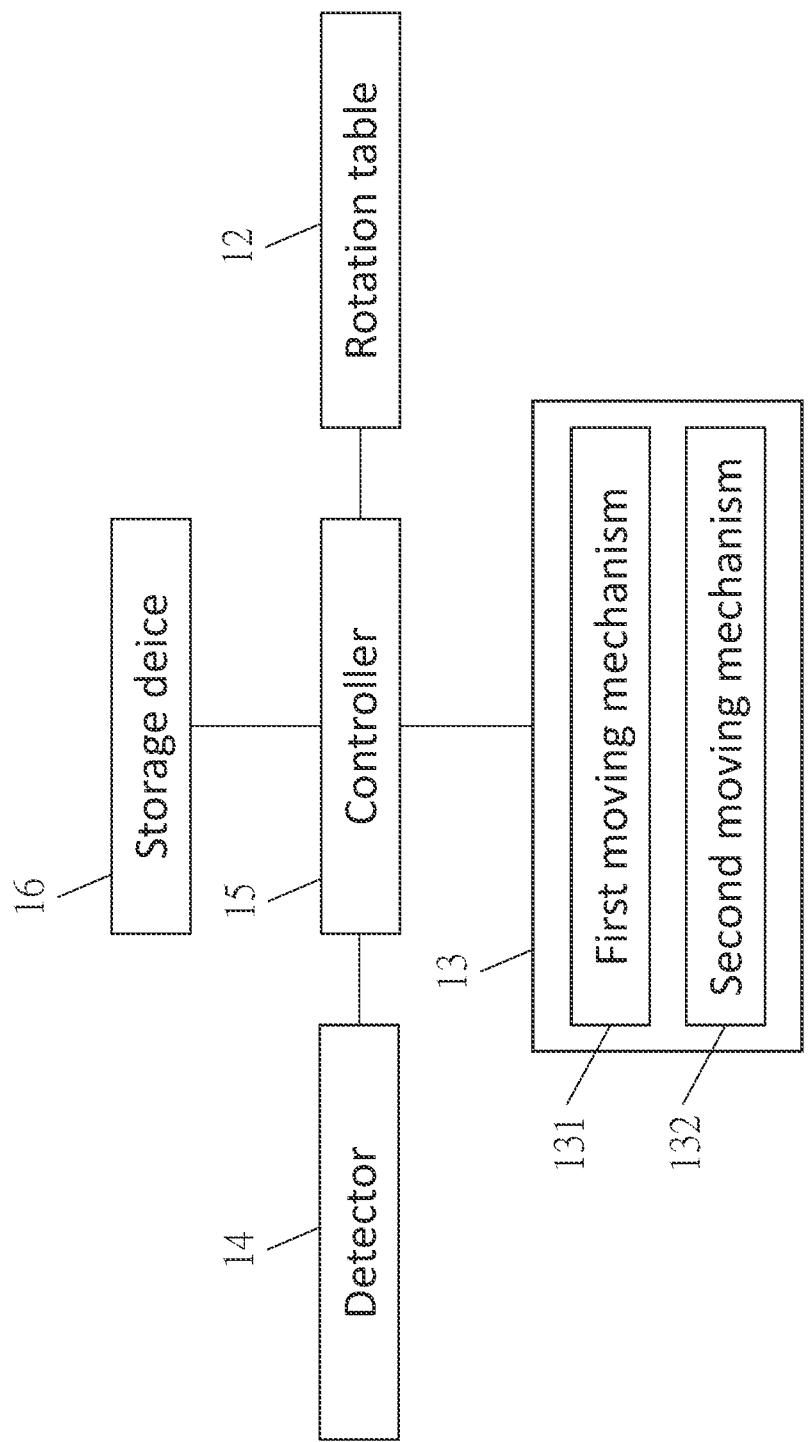
FIG. 3 is a functional block diagram of the system for detecting positions of wafers drawn according to an embodiment of the present invention.
Figure 4A:
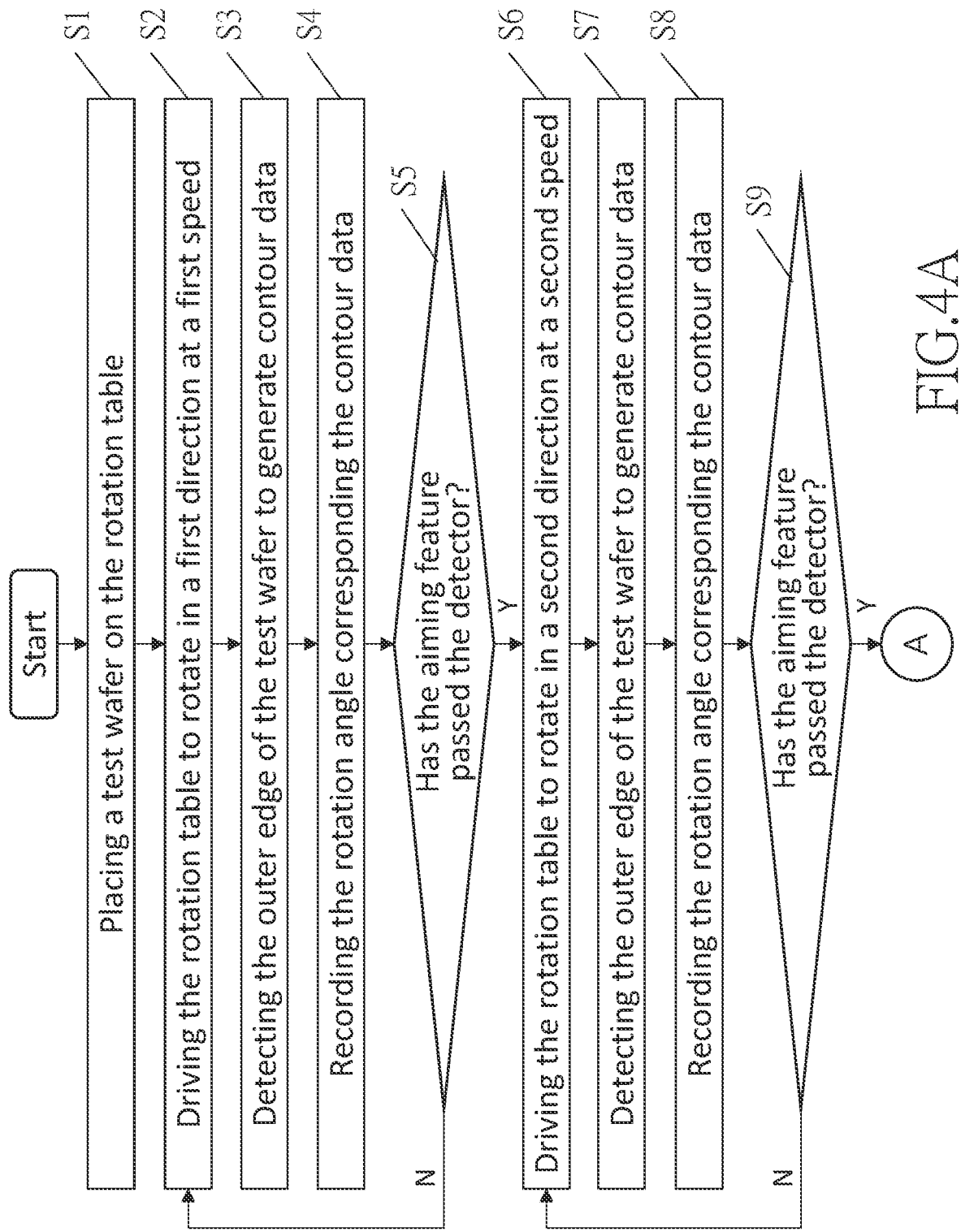
FIGS. 4A to 4B show a flowchart of the method for detecting positions of wafers drawn according to an embodiment of the present invention.
Figure 4B:
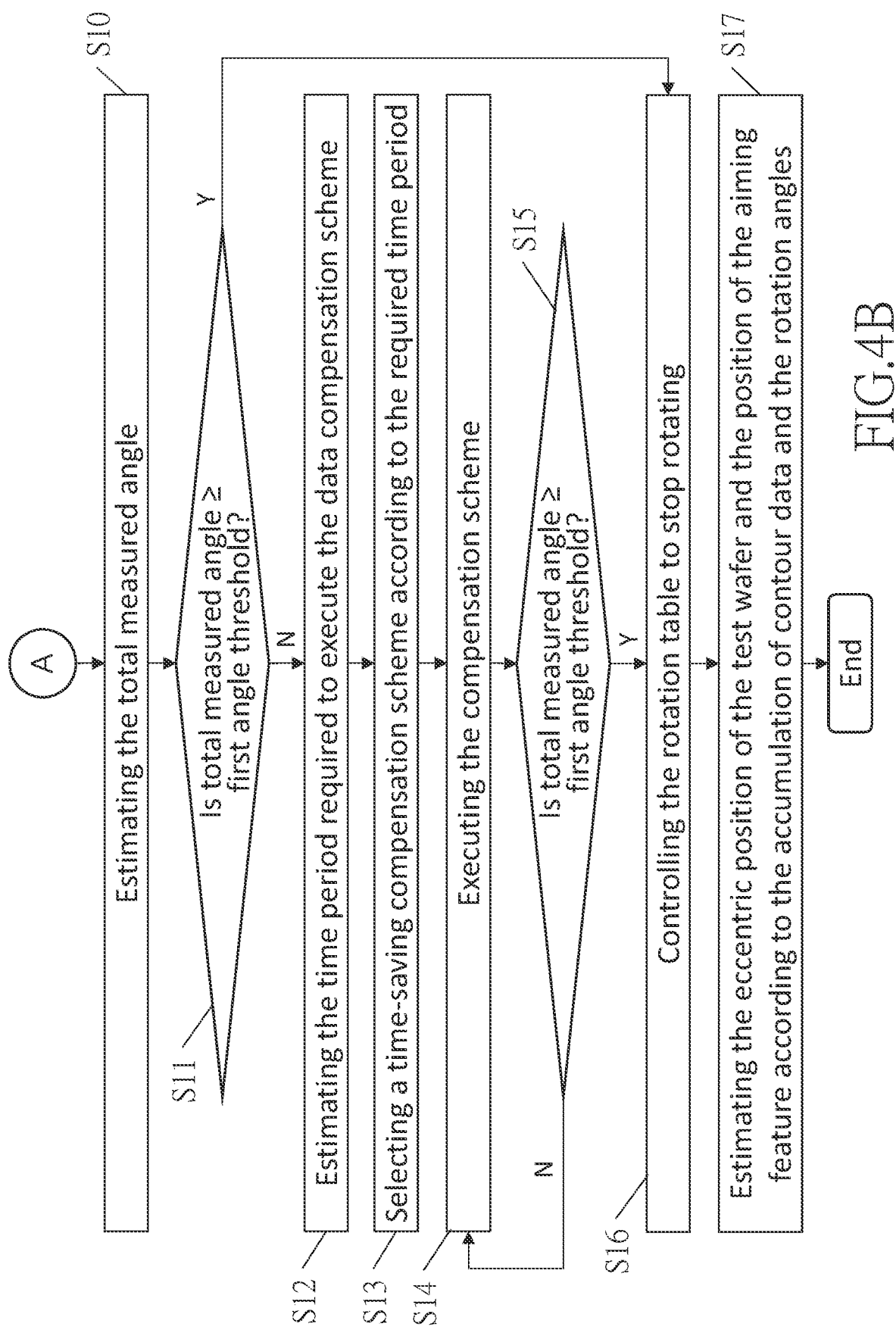

Please refer to FIGS. 1 to 3, a system 10 for detecting positions of wafers according to an embodiment of the present invention is adapted to be applied to a wafer aligner (i.e., an apparatus capable of detecting positions of wafers and aligning and correcting the positions of the wafers), and the system 10 for detecting positions of wafers includes a base 11, a rotation table 12, a moving platform 13, a detector 14, a controller 15 and a storage device 16. The rotation table 12, the moving platform 13 and the detector 14 are arranged to the base 11, and the controller 15 is electrically connected to the rotation table 12, the moving platform 13, the detector 14 and the storage device 16 to perform a method of detecting positions of wafers.

The rotation table 12 is used to carry a wafer 20. The rotation table 12 is controlled by the controller 15 to rotate at different speeds and rotate in a first direction (for example, clockwise) and in a second direction (for example, counter-clockwise). The first direction is opposite to the second direction. The rotation of the rotation table 12 can drive the wafer 20 placed on the rotation table 12 to rotate at the same speed and direction.

The moving platform 13 includes a first moving mechanism 131 and a second moving mechanism 132. The first moving mechanism 131 and the second moving mechanism 132 are movably disposed to the base 11. The first moving mechanism 131 can move in a third direction (for example, the X-axis direction), and the second moving mechanism 132 can move in a fourth direction (for example, the Y-axis direction), and the third direction is perpendicular to the fourth direction. Therefore, when the rotation table 12 is arranged to the moving platform 13, the first moving mechanism 131 and the second moving mechanism 132 can work together to move the rotation table 12 in the third direction, the fourth direction, or both on a plane.

The detector 14 is arranged near the rotation table 12. The detector 14 can be, for example, an optical detector, such as at least one light emitter and at least one light receiver that work together to detect the contour 21 of the wafer 20. The detector 14 has a detection coverage 141. Taking the example of the detector 14 implemented by a light emitter and a light receiver, the detection coverage 141 can be, for example, the area covered by the detecting light between the light emitter and the light receiver. In order to let the detection coverage 141 of the detector 14 cover a part of the contour 21 of the wafer 20 so that the detector 14 can detect the contour 21 of the wafer 20, the controller 15 can control the movement of at least one of the first moving mechanism 131 and the second moving mechanism 132 of the moving platform 13 so that the rotation table 12 arranged on the moving platform 13 can approach the detector 14, and then the contour 21 of the wafer 20 on the rotation table 12 can enter the detection coverage 141 of the detector 14. For example, as shown in FIG. 5A, the detection coverage 141 of the detector 14 overlaps a part of the contour 21 of the wafer 20.

The storage apparatus 16 is used to store various program instructions, parameters, and thresholds required for the operation of the system 10 for detecting the wafer position, and for the controller 15 to access and then execute the method for detecting the wafer position.

The following will illustrate how the system 10 for detecting positions of wafers executes the method of detecting positions of wafers. Please further refer to FIGS. 4A, 4B, and 5A to 5D, the method of detecting positions of wafers includes the following steps.

Figure 5A:
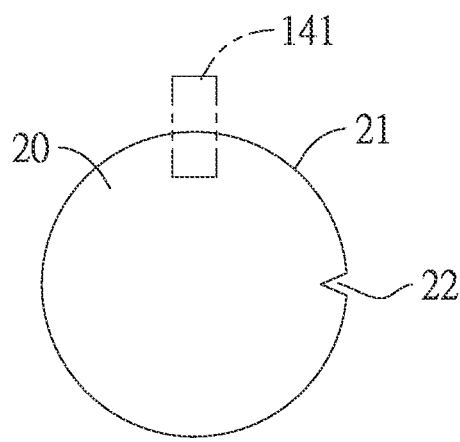
FIGS. 5A to 5D show schematic diagrams of the states of detecting the periphery of the wafer in the method for detecting positions of wafers drawn according to an embodiment of the present invention.

First, place a wafer 20 on the rotation table 12, as shown in step S1 and FIG. 5A. The contour 21 of the wafer 20 includes an aiming feature 22. The aiming feature 22 can be, for example, a notch, a flange, or a cut. Then, the controller 15 drives the rotation table 12 to rotate in a first direction D1 at a first speed V1, as shown in step S2, to drive the wafer 20 to rotate at the same speed and in the same direction, as shown in FIG. 5B.

While the rotation table 12 is rotating, the controller 15 controls the detector 14 to detect the contour 21 of the wafer 20 rotating at the first speed V1 in the first direction D1, so as to generate a respective piece of contour data corresponding to a respective currently-detected position on the contour 21, and send this piece of contour data to the controller 15, as shown in step S3. In addition, the controller 15 records a current rotation angle of the rotation table 12 whenever obtaining a respective piece of contour data, as shown in step S4. The respective piece of contour data is related to the relative distance from a corresponding detected position on the contour 21 of the wafer 20 to the rotation center of the rotation table 12.

Figure 6:
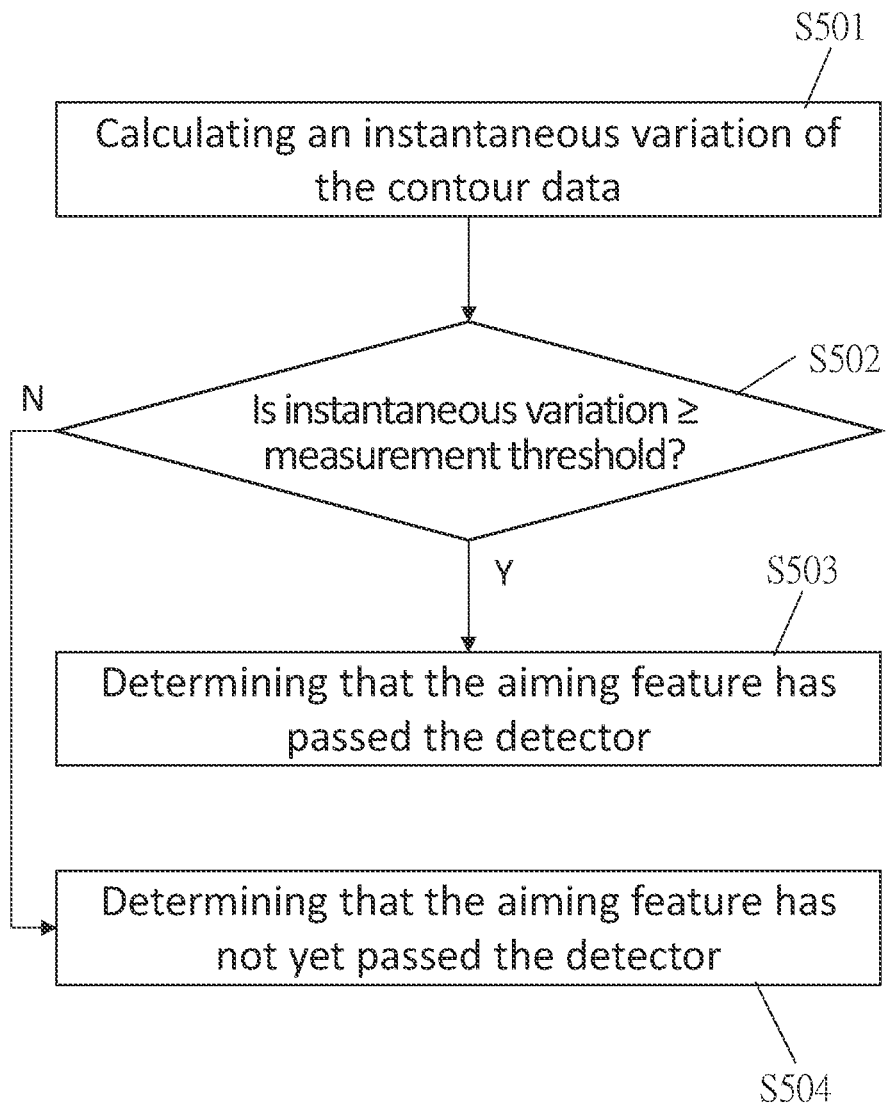
FIG. 6 is a flowchart of a method for determining whether the aiming feature passes through a detector drawn according to an embodiment of the present invention.
Figure 7A:
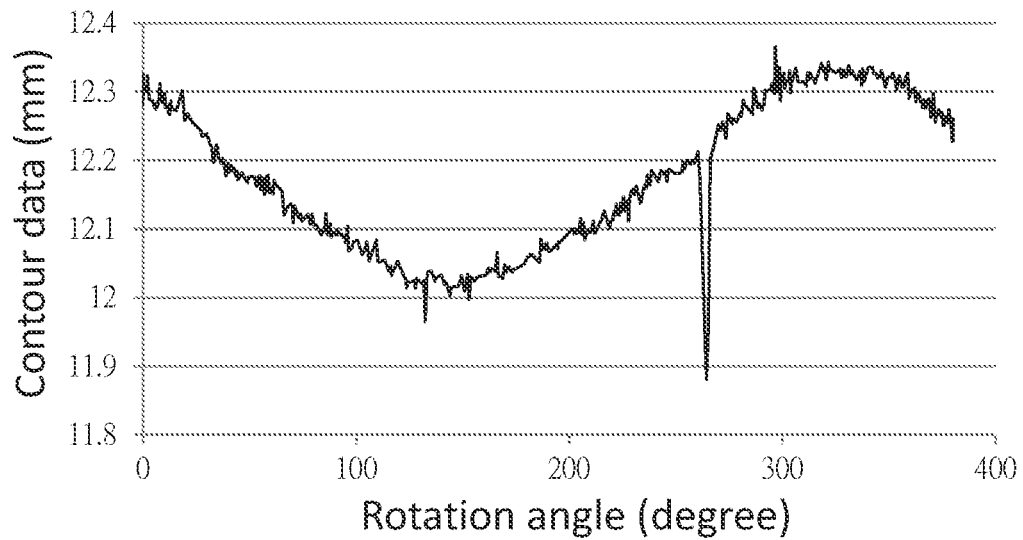
FIG. 7A is a graph drawn to show a curve of two-dimensional information converted from one-dimensional contour data according to an embodiment of the present invention.
Figure 7B:
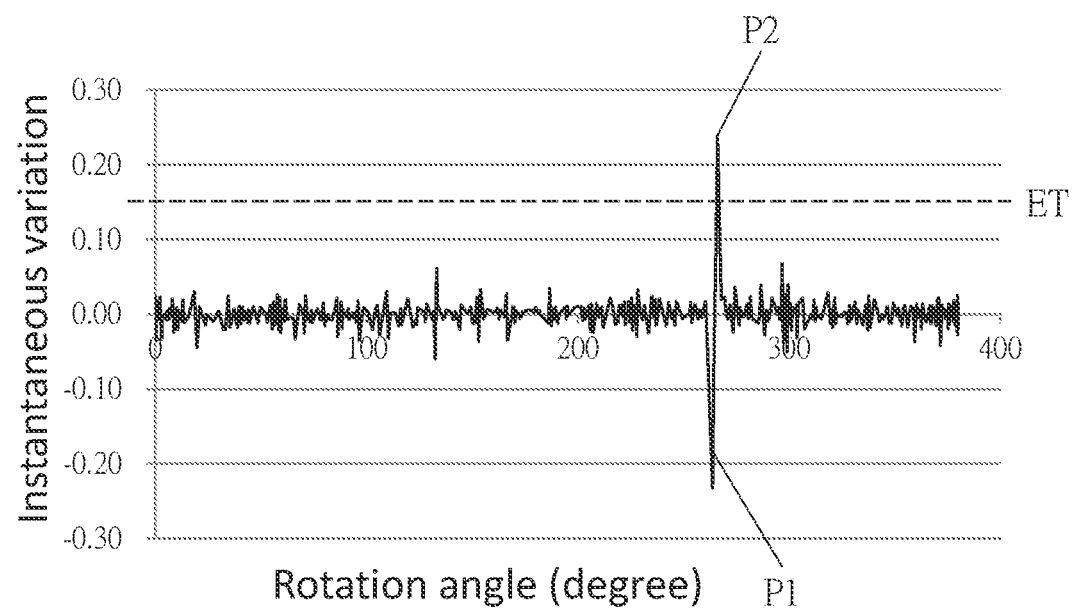
FIG. 7B is a graph showing a curve of instantaneous variation values converted from the contour data in FIG. 7A.
Figure 8:
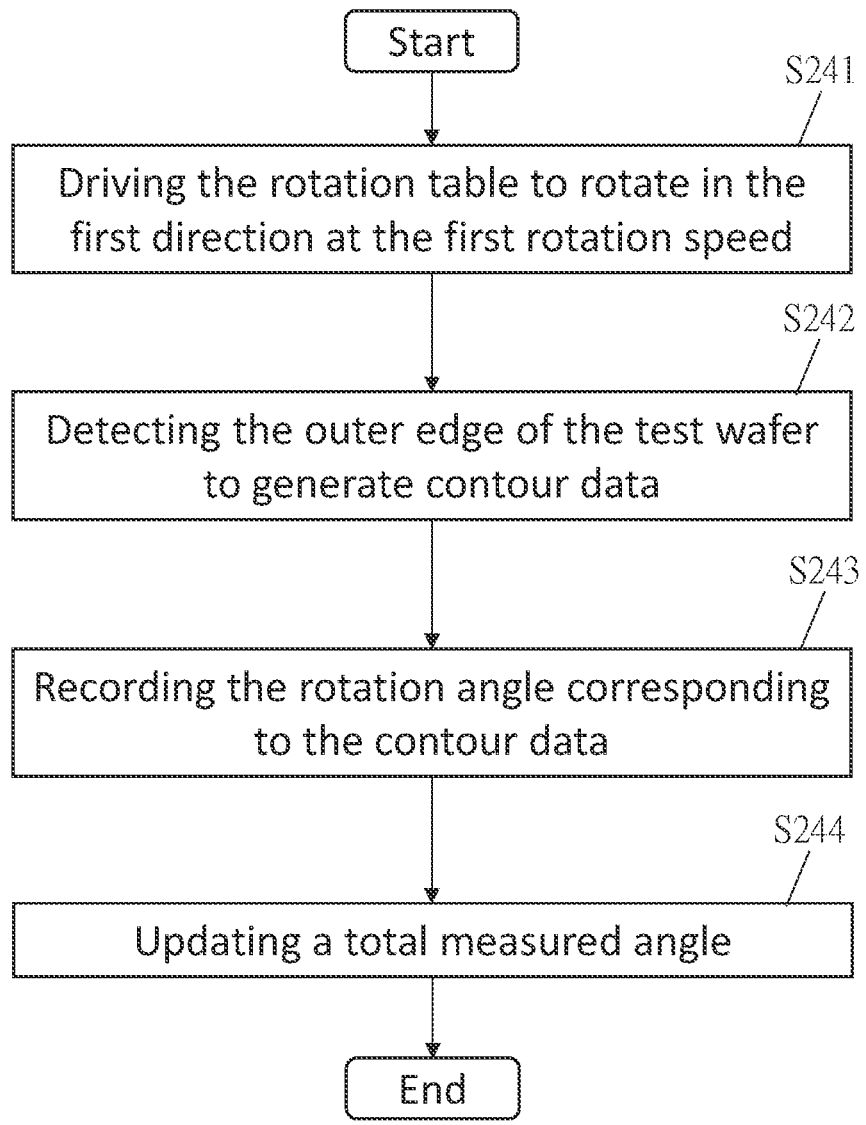
FIG. 8 is a flowchart of a first compensation scheme drawn according to an embodiment of the present invention.

Then, the controller 15 determines whether the aiming feature 22 has passed the detection coverage 141 of the detector 14 according to the obtained respective piece of contour data, as in step S5. The method of determining whether the aiming feature 22 has passed the detection coverage 141 of the detector 14 according to the obtained respective piece of contour data is illustrated as follows. Please refer to FIGS. 6, 7A and 7B. A piece of contour data generated based on a respective detected position on the contour 21 corresponds to a rotation angle of the rotation table 12, that is, corresponds to a rotation angle of the wafer 20. The detection result generated by the detector 14 is shown in FIG. 7A, where the horizontal axis represents the rotation angles of the rotation table 12 (i.e., the rotation angle of the wafer 20), and the vertical axis represents the values of the respective pieces of contour data. Whenever a piece of contour data is obtained, the controller 15 calculates an instantaneous variation value for the piece of contour data, as shown in step S501. The controller 15 calculates the instantaneous variation value of each piece of contour data by, for example, calculating a differential of each piece of contour data, as shown in FIG. 7B. In FIG. 7B, the horizontal axis represents the rotation angles of the rotation table 12 (i.e., the wafer 20), and the vertical axis represents the instantaneous variation values of the respective pieces of contour data.

Then, every time an instantaneous variation value is obtained, the controller 15 will further determine whether the instantaneous variation value is greater than or equal to a measurement threshold, as shown in step S502. The measurement threshold is a preset value, and represents that the currently-detected position on the contour 21 of the wafer 20 is the position of the aiming feature 22.

Figure 5C:
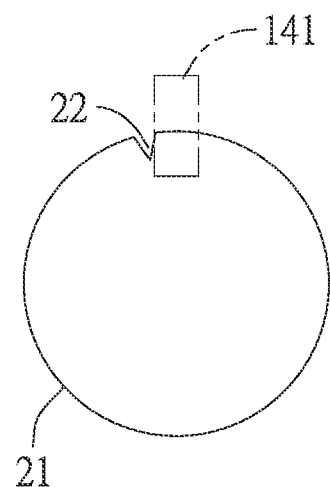
Figure 5B:
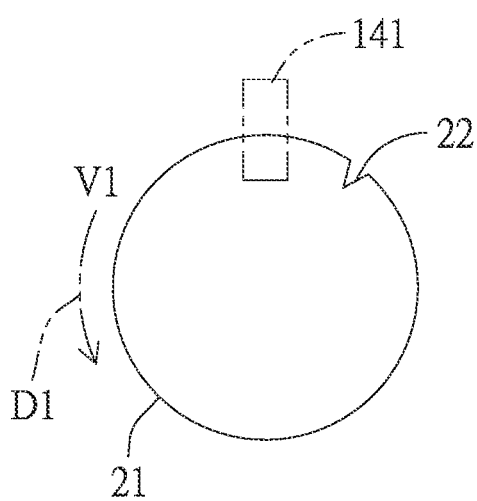

When the instantaneous variation value is greater than or equal to the measurement threshold, the controller 15 determines that the aiming feature 22 has passed the detection coverage 141 of the detector 14, as shown in step S503 and FIG. 5C. Compared with detecting other positions on the contour 21 of the wafer 20, when the aiming feature 22 on the contour 21 of the wafer 20 passes the detection coverage 141 of the detector 14, the instantaneous variation value obtained by the controller 15 will change drastically, such as the peak P2 appearing on the curve shown in FIG. 7B and having a peck value greater than the preset measurement threshold ET. Conversely, when the instantaneous variation value is less than the measurement threshold, the controller 15 determines that the aiming feature 22 has not yet passed the detection coverage 141 of the detector 14, as shown in step S504 and FIG. 5B.

When the controller 15 determines that the aiming feature 22 of the wafer 20 has not yet passed the detection coverage 141 of the detector 14, the controller 15 will return to step S2 and repeat steps S2 to S5 until the aiming feature 22 has passed the detection coverage 141 of the detector 14 in step S5.

Figure 5D:
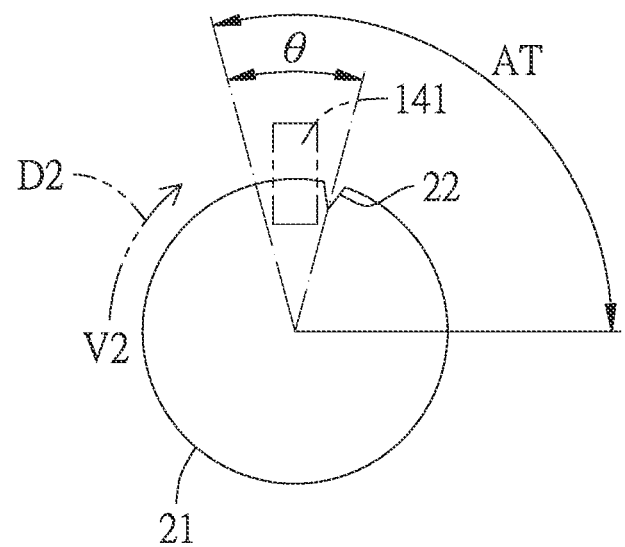

In step S5, when the aiming feature 22 passes the detection coverage 141 of the detector 14, the controller 15 further drives the rotation table 12 to rotate in a second direction D2 at a second speed V2, as shown in step S6, so that the wafer 20 is also rotated at the same speed and in the same direction, as shown in FIG. 5D. An angle, by which the rotation table 12 rotates in the first direction D1 at the first speed V1 is larger than 0 degree but less than 360 degrees. The second speed V2 may be, for example, less than the first speed V1, and the second direction D2 is opposite to the first direction D1. While the rotation table 12 is rotating, the controller 15 controls the detector 14 to detect the contour 21 of the wafer 20 rotating under the conditions of the second speed V2 and the second direction D2 to generate a respective piece of contour data corresponding to a respective currently-detected position on the contour 21, and send it to the controller 15, as shown in step S7 and FIG. 5D, and the controller 15 records the rotation angle of the rotation table 12 corresponding to the respective piece of contour data, such as shown in step S8. In detail, since the second rotation speed V2 is less than the first speed V1, the contour 21 of the wafer 20 rotating at the second speed V2 can be scanned in more detail to obtain more pieces of contour data and the accumulation of contour data becomes more complete, especially the contour data regarding the aiming feature 22. In this embodiment or other embodiments, the rotation table 12 is rotating reversely at this time, and certain positions on the contour 21 of the wafer 20 are repeatedly detected by the detector 14, so that some pieces of the contour data obtained under the conditions of the second speed V2 and the second direction D2 may overlap some pieces of contour data obtained under the conditions of the first speed V1 and the first direction D1. In this case, in the new and old contour data corresponding to the same position on the contour 21 of the wafer 20, the new contour data can, for example, replace the old contour data, can be retained together with the old contour data, or can be ignored.

In addition, the controller 15 will also determine whether the aiming feature 22 passes the detection coverage 141 of the detector 14 again according to the contour data obtained under the conditions of the second speed V2 and the second direction D2, as shown in step S9. For the method of determining whether the aiming feature 22 passes the detection coverage 141 of the detector 14 again, please refer to the above description of step S5, and its related description is omitted herein. Alternatively, the method of determining whether the aiming feature 22 passes through the detection coverage 141 of the detector 14 again can also be determined by determining whether the rotation angle $\downarrow$' of the rotation table 12 under the conditions of the second speed V2 and the second direction D2 is greater than or equal to a second angle threshold.

When the aiming feature 22 has not yet passed the detection coverage 141 of the detector 14 in step S9, return to step S6, and repeat steps S6 to S9 until the aiming feature 22 passes the detection coverage 141 of the detector 14. When the aiming feature 22 passes the detection coverage 141 of the detector 14, the controller 15 estimates a total measured angle AT, as in step S10. An angle, by which the rotation table 12 rotates in the second direction D2 at the second speed V2, is also larger than 0 degree but less than 360 degrees. The total measured angle AT can, for example, refer to the angle corresponding to the range detected on the contour 21 of the wafer 20 by the detector 14 while the rotation table 12 is rotating. Therefore, the controller 15 can calculate the total measured angle AT based on the rotation angles corresponding to the accumulation of contour data and corresponding to all the detected positions on the contour 21.

Then, the controller 15 further determines whether the total measured angle AT is greater than or equal to a first angle threshold, as shown in step S11. The first angle threshold may be a preset value, for example, the angle corresponding to the data volume of the contour data required to calculate the deviation amount under an acceptable error range, and the data volume is based on the specification of the wafer 20. That is, the first angle threshold is, in order to calculate the deviation within the acceptable error range, the angle corresponding to the range, which the detector 14 should detect, on the contour 21 of the wafer 20. The first angle threshold is larger than 0 degree but less than 360 degrees.

When the current total measured angle AT is greater than or equal to the first angle threshold, it means that the data volume (or the total number) of the current accumulation of contour data is sufficient to calculate the deviation within the error range. At this time, the controller 15 can control the rotation table 12 to stop rotating and the detector 14 to stop detecting, as in step S16. Conversely, when the current total measured angle AT is less than the first angle threshold, it means that the data volume of the current accumulation of contour data is still insufficient to calculate the deviation within the error range, and the shortage of data volume needs to be made up at this time. To this end, in this embodiment or other embodiments, the system 10 for detecting positions of wafers may further provide one or more compensation schemes for the controller 15 to choose. At this time, the controller 15 can pre-estimate the time required to execute a respective compensation scheme according to the current total measured angle AT and the preset first angle threshold, as shown in step S12. Then, the controller 15 selects a time-saving compensation scheme according to the estimated result, as shown in step S13; and executes the selected compensation scheme, as shown in step S14, to make up the shortage of data volume. Two compensation schemes are listed below as examples to illustrate.

Figure 9A:
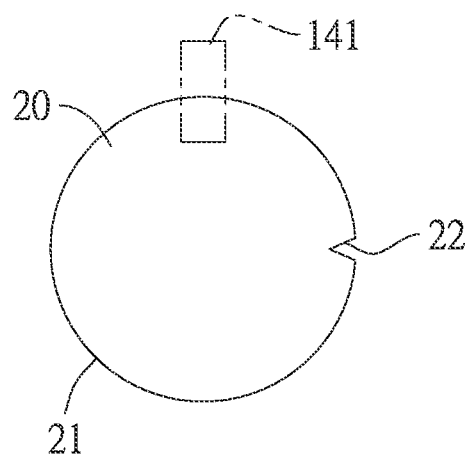
FIGS. 9A to 9E are schematic diagrams showing the states that the detector detects the periphery of the wafer in the first compensation scheme according to an embodiment of the present invention.
Figure 9B:
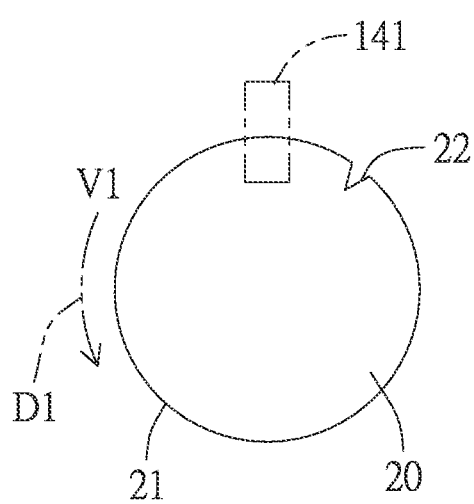
Figure 9C:
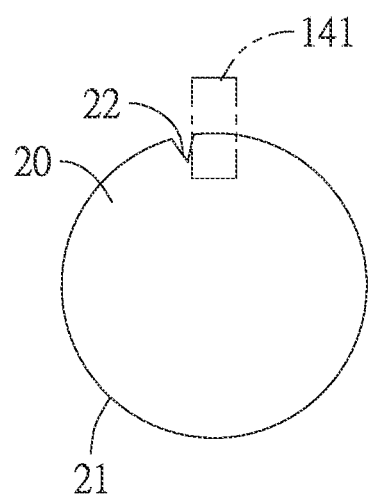
Figure 9D:
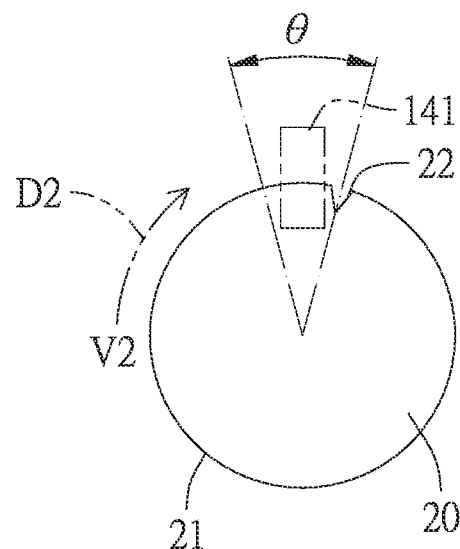
Figure 9E:
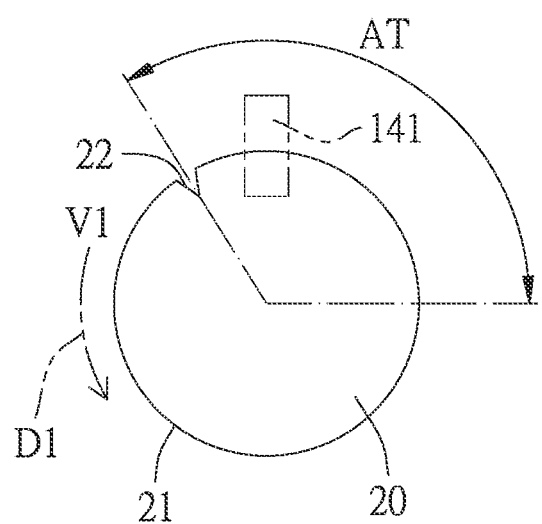
Figure 10:
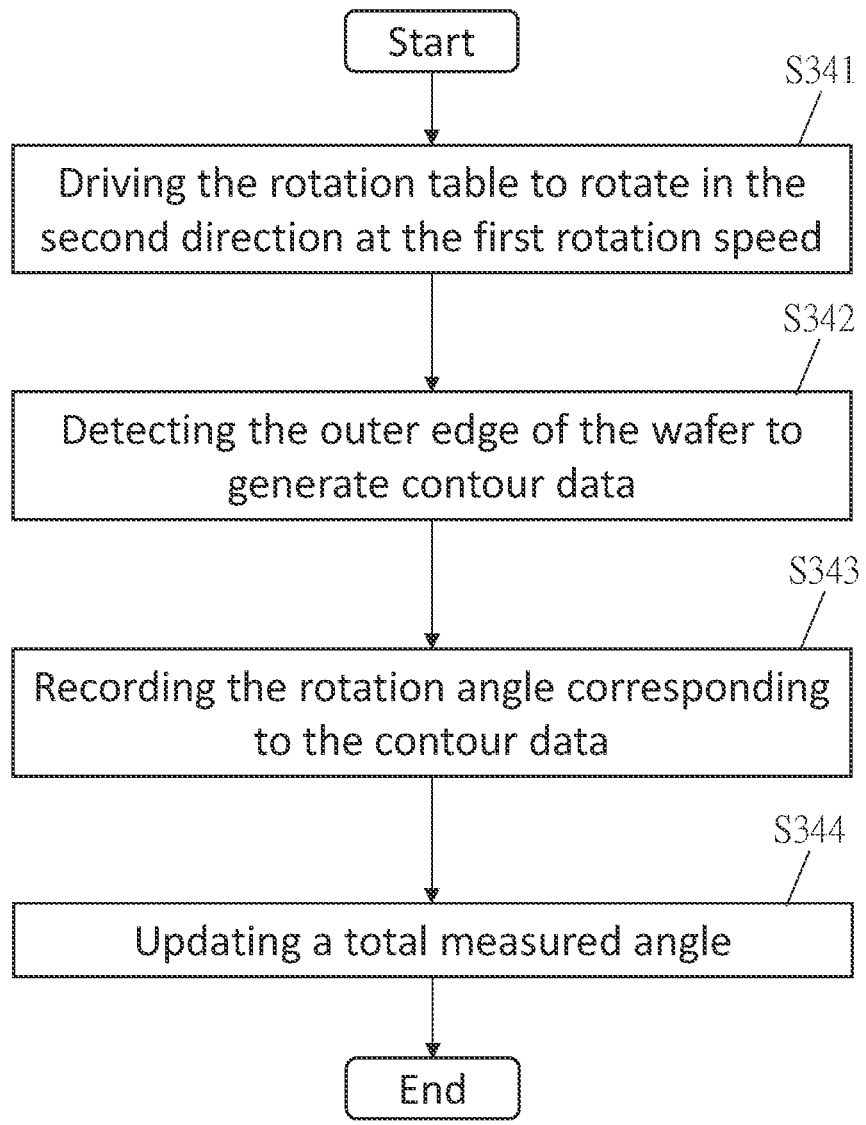
FIG. 10 is a flowchart of a second compensation scheme drawn according to an embodiment of the present invention.

Please refer to FIGS. 8 and 9A to 9E illustrating a first compensation scheme. After executing steps S1 to S11 in FIGS. 4A and 4B (corresponding to the process of detecting the wafer 20 in FIGS. 9A to 9D), the controller 15 executes the first compensation scheme as follows. First, the controller 15 subsequently drives the rotation table 12 to rotate in the first direction D1 at the first speed V1, as shown in step S241, so that the wafer 20 is rotated in the same direction at the same speed, as shown in FIG. 9E. While the rotation table 12 is rotating, the controller 15 controls the detector 14 to detect the contour 21 of the wafer 20 to generate a respective piece of contour data corresponding to a respective currently-detected position on the wafer 20, as shown in step S242. In addition, the controller 15 records the corresponding rotation angle of the rotation table 12 when this piece of contour data is generated, as shown in step S243. Finally, a new total measured angle AT is estimated based on the accumulation of contour data, as shown in step S244.

The time required to execute the first compensation scheme can be estimated by the following formula (1), for example:

$$T1=C1'/V1+(C1-C1')/V1+\Delta t1 \qquad (1)$$

where T1 represents the time required to execute the first compensation scheme; C1 represents the target data volume; C1' represents the currently-accumulated data volume; V1 represents the first speed used when the contour 21 is roughly detected; and $\Delta t1$ represents the time required for the transition of the rotation table 12 from rotating under the conditions of the second speed V2 and the second direction D2 to rotating under the conditions of the first speed V1 and the first direction D1.

Figure 11A:
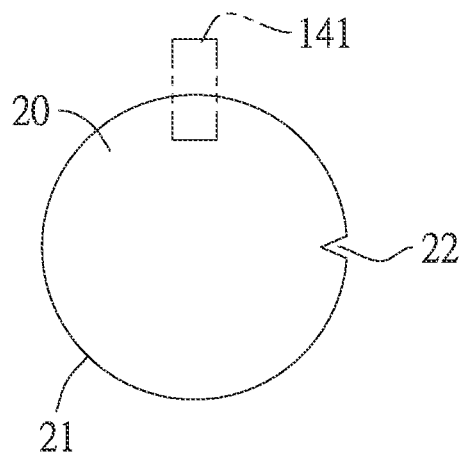
FIGS. 11A to 11E are schematic diagrams showing the states that the detector detects the periphery of the wafer in the second compensation scheme according to an embodiment of the present invention.
Figure 11B:
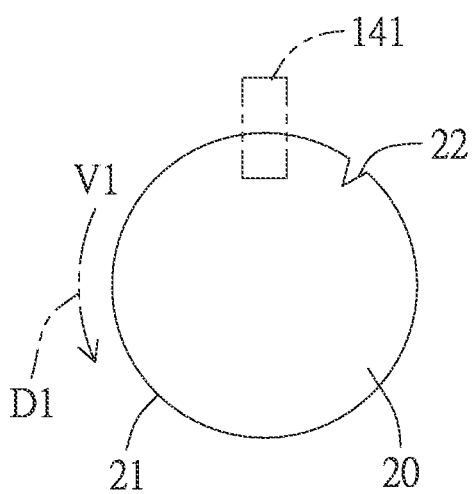
Figure 11C:
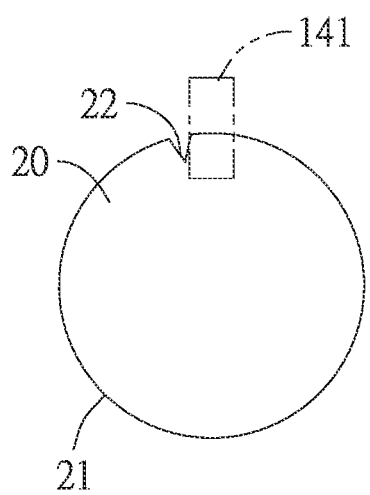
Figure 11D:
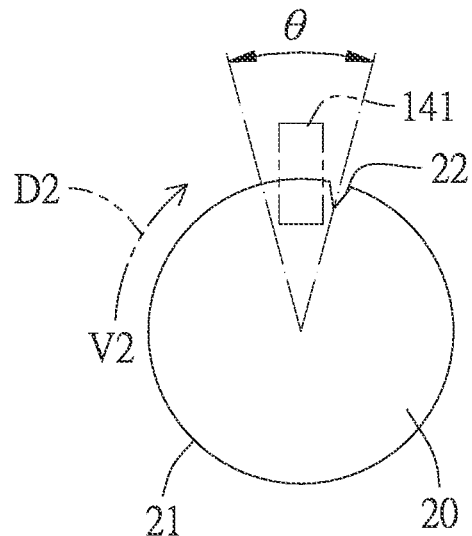
Figure 11E:
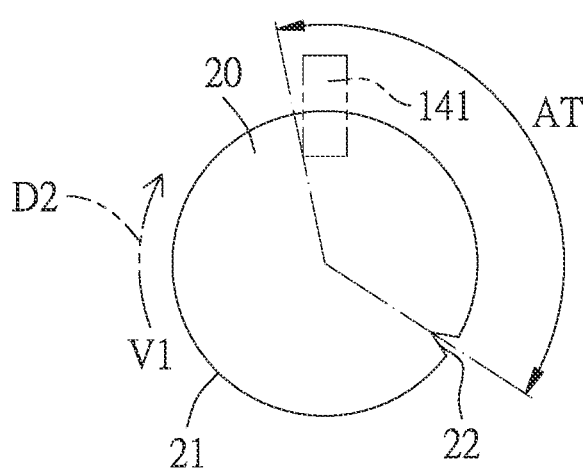

Please refer to FIGS. 10 and 11A to 11E illustrating a second compensation scheme. After executing steps S1 to S11 in FIGS. 4A and 4B (corresponding to the process of detecting the wafer 20 in FIGS. 11A to 11D), the controller 15 executes the second compensation scheme as follows. First, the controller 15 subsequently drives the rotation table 12 to rotate in the second direction D2 at the first speed V1, as shown in step S341, to rotate the wafer 20 in the same direction at the same speed, as shown in FIG. 11E. While the rotation table 12 is rotating, the controller 15 controls the detector 14 to detect the contour 21 of the wafer 20 to generate a respective piece of contour data corresponding to a respective currently-detected position on the wafer 20, as shown in step S342. In addition, the controller 15 records the corresponding rotation angle of the rotation table 12 when this piece of contour data is generated, as shown in step S343. Finally, a new total measured angle AT is estimated based on the accumulation of contour data, as shown in step S344.

The time required to execute the second compensation scheme can be estimated by the following formula (2), for example:

$$T2=C1'/V1+C1/V1+\Delta t2 \qquad (2)$$

where T2 represents the time required to execute the second compensation scheme; C1 represents the target data volume; C1' represents the currently-accumulated data volume; V1 represents the first rotation speed used when the contour 21 is roughly detected; and $\Delta t2$ is the time required for the transition of the rotation table 12 from rotating under the conditions of the second speed V2 and the second direction D2 to rotating under the conditions of the first speed V1 and the second direction D2.

Therefore, the controller 15 can estimate the time required to execute each compensation scheme based on the current total measured angle AT (i.e., the sum of the measured angles) and the first angle threshold, that is, the currently-accumulated data volume and the target data volume, and chooses a more time-saving compensation scheme based on the estimated result.

In this embodiment or other embodiments, when only one compensation scheme is provided, the above steps S12 to S13 can be omitted, that is, in step S11, when the total measured angle AT is smaller than the first angle threshold, the controller 15 directly executes this compensation scheme.

After obtaining the updated total measured angle AT, the controller 15 determines whether the updated total measured angle AT is greater than or equal to the first angle threshold, as shown in step S15. When the updated total measured angle AT is still less than the first angle threshold, return to step S14 and repeat steps S14 to S15 until the updated total measured angle AT is greater than or equal to the first angle threshold.

When the updated total measured angle AT in step S15 is greater than or equal to the first angle threshold, it means that the currently-accumulated data volume has reached the target data volume, and the controller 15 can control the rotation table 12 to stop rotating and the detector 14 to stop detecting, as shown in step S16. At this time, the controller 15 can estimate the eccentric position of the wafer 20 and the position of the aiming feature 22 according to the accumulation of contour data and the rotation angles corresponding thereto, as shown in step S17.

Figure 12:
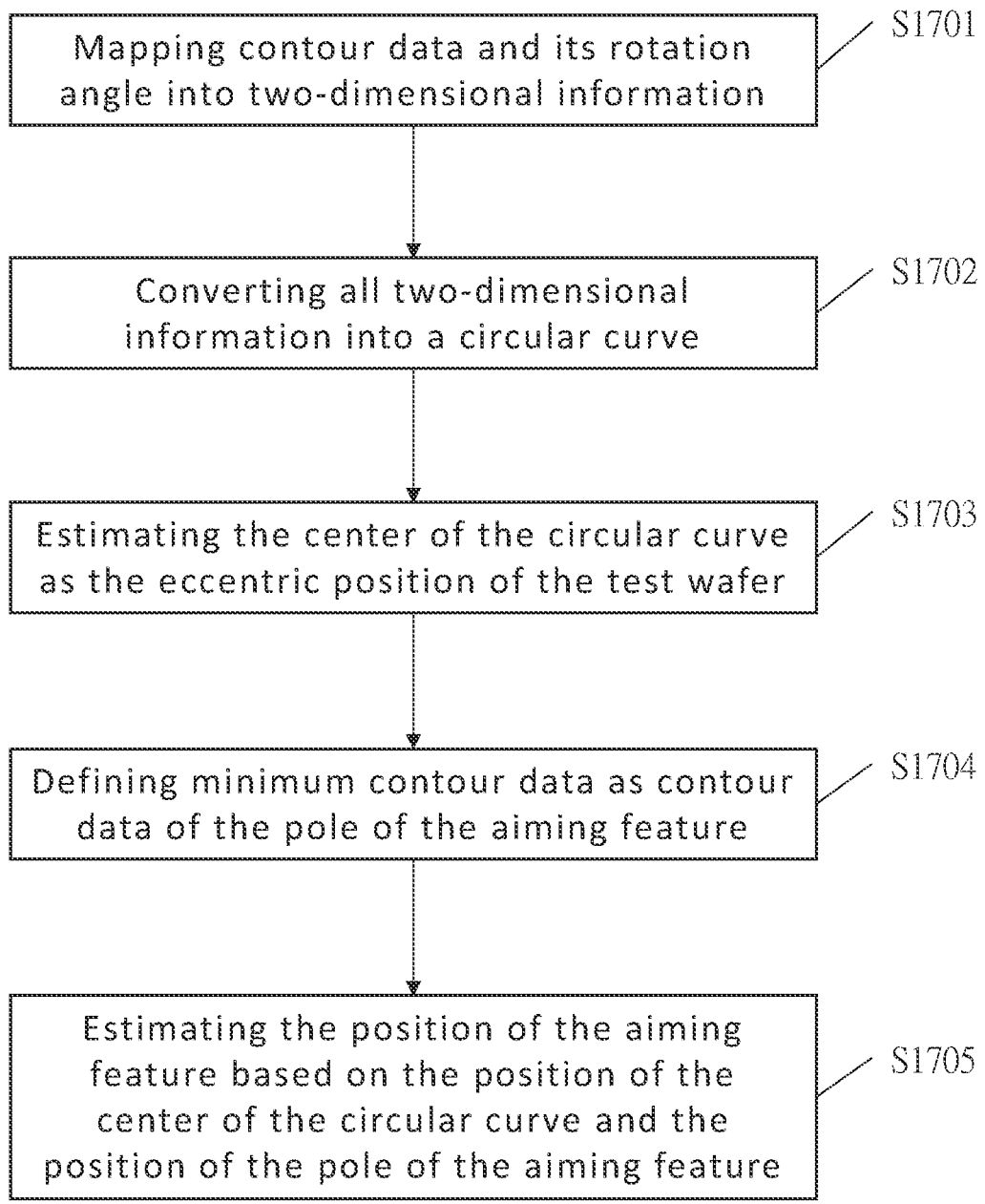
FIG. 12 is a flowchart of a method for estimating the eccentric position of the wafer and the position of the aiming feature according to an embodiment of the present invention.

An example for estimating the eccentric position of the wafer 20 and the position of the aiming feature 22 is as follows. Please refer to FIG. 12, taking the aiming feature 22 as a notch as an example for illustration. First, map each obtained piece of contour data and its corresponding rotation angle into a respective piece of two-dimensional information as shown in FIG. 7A, as shown in step S1701. In detail, the controller 15 can use the following formula (3) to map a respective piece of one-dimensional contour data and a corresponding rotation angle into a respective piece of two-dimensional information:

$$\begin{bmatrix} X_i \\ Y_i \end{bmatrix} = \begin{bmatrix} S_i \times \cos\theta_i \\ S_i \times \sin\theta_i \end{bmatrix} \qquad (3)$$

where $X_i$ represents the X coordinate of the i-th mapping; $Y_i$ represents the Y coordinate of the i-th mapping; $S_i$ represents the i-th piece of contour data generated by the detector 14 detecting the contour; and $\theta_i$ represents the rotation angle of the rotation table 12 when the i-th piece of contour data is obtained.

Next, the controller 15 converts the two-dimensional information into a circular curve corresponding to all the detected positions on the contour of the wafer, as shown in any one of FIGS. 14A to 14D in step S1702. For example, the controller 15 can use the following formula (5) to convert all the two-dimensional information into a circular curve:

$$Err=\Sigma_{i=1}^{n}\{(X_i-\Delta X)^2+(Y_i-\Delta Y)^2-R^2\}^2 \qquad (4)$$

where n represents the amount of instantaneous variation values; $X_i$ represents the X coordinate of the i-th instantaneous variation value; $Y_i$ represents the Y coordinate of the i-th instantaneous variation value; $\Delta X$ represents the deviation of the center on the X axis; $\Delta Y$ represents the deviation of the center on the Y axis; and R represents the radius of the circular curve. After forming the circular curve, the controller 15 can calculate the center of the circular curve as the eccentric position of the wafer 20, as shown in step S1703.

Next, the controller 15 defines a minimum piece of contour data among the accumulation of contour data as the contour data of the pole 23 of the aiming feature 22, as shown in step S1704. Finally, the controller 15 can calculate the position of the aiming feature 22 based on the position of the center of the circular curve and the position, corresponding to the contour data of the pole 23 of the aiming feature 22, on the circular curve, as shown in step S1705.

In this way, the wafer aligner can estimate the deviation of the center of the wafer 20 and the angular deviation of the aiming feature 22 according to the eccentric position of the wafer 20, the position of the aiming feature 22, and the position of the rotation center of the rotation table 12, to further compensate for these deviations, so that the center of the wafer 20 is aligned with the rotation center of the rotation table 12.

In addition, in this embodiment, the method of obtaining the above-mentioned measurement threshold ET and the first angle threshold can be, for example, the existing method of detecting positions of wafers, such as Japanese grant patent No. 2729297, Japanese grant patent No. 3223584, and Japanese grant patent No. 4226241, or other existing methods to perform edge detection on the entire contour of a wafer template to obtain results. The wafer template used is the same wafer as the wafer 20 described above, so this wafer template has the same contour 21 and the same aiming feature 22.

After detecting the complete contour 21 of the wafer template, the controller 15 can calculate the instantaneous variation value of each piece of contour data, and select at least one peak value from these instantaneous variation values, such as the peak values of the peak P1 and peak P2 in FIG. 7B to define the measurement threshold ET according to the selected peak value(s). Taking the peak value of the peak P2 as an example, the measurement threshold ET may be less than or equal to the peak value of the peak P2, but greater than other values on the curve except for the two peaks P1 and P2.

Figure 13:
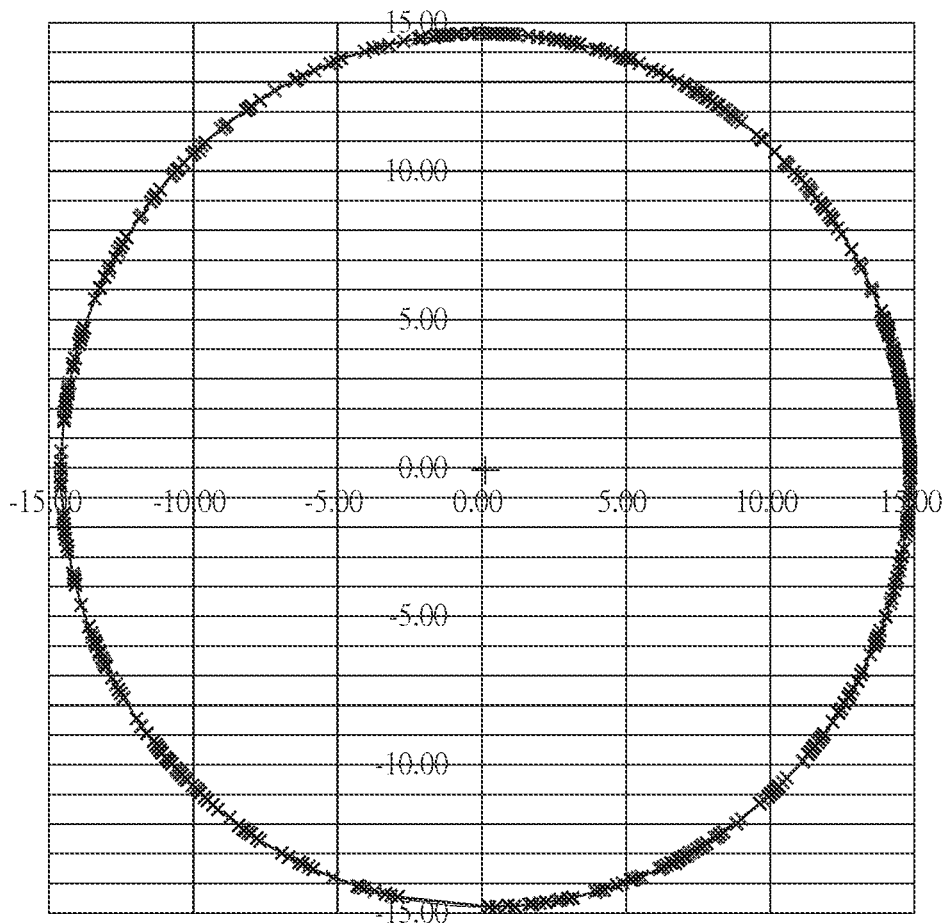
FIG. 13 is a graph of a circular curve simulated from accumulated contour data according to an embodiment of the present invention.
Figure 14A:
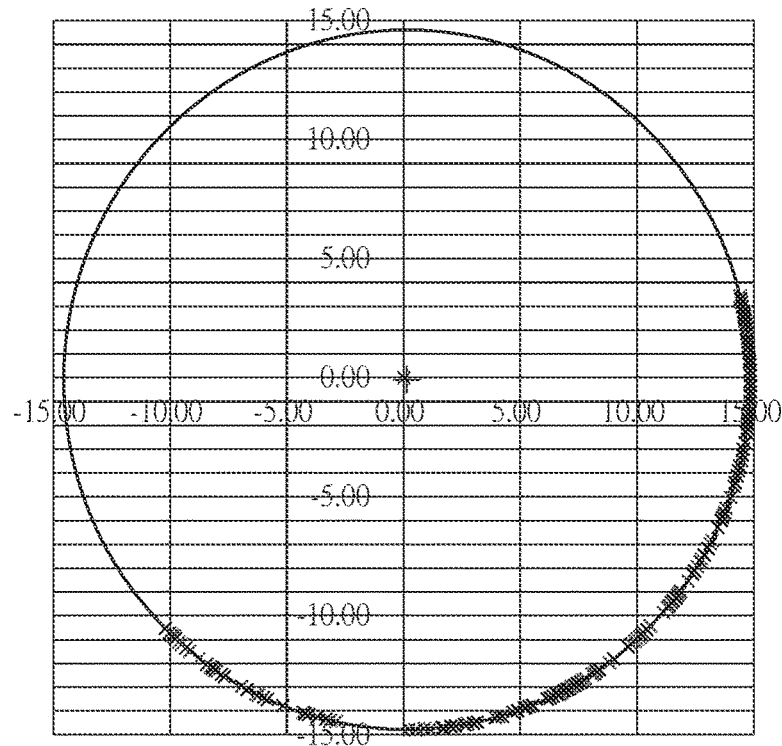
FIG. 14A is a graph of a circular curve of a first test result according to an embodiment of the present invention.
Figure 14B:
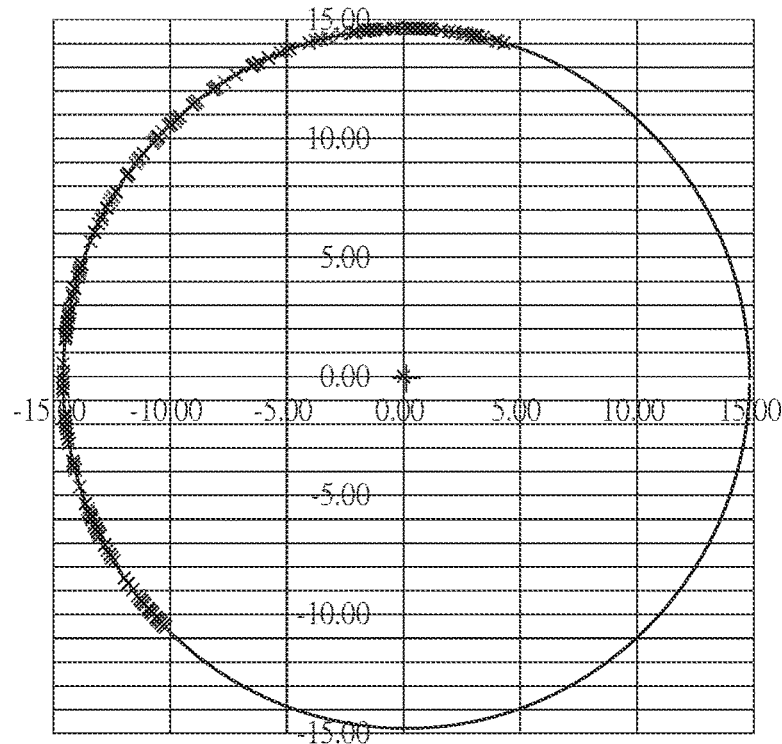
FIG. 14B is a graph of a circular curve of a second test result according to an embodiment of the present invention.
Figure 14C:
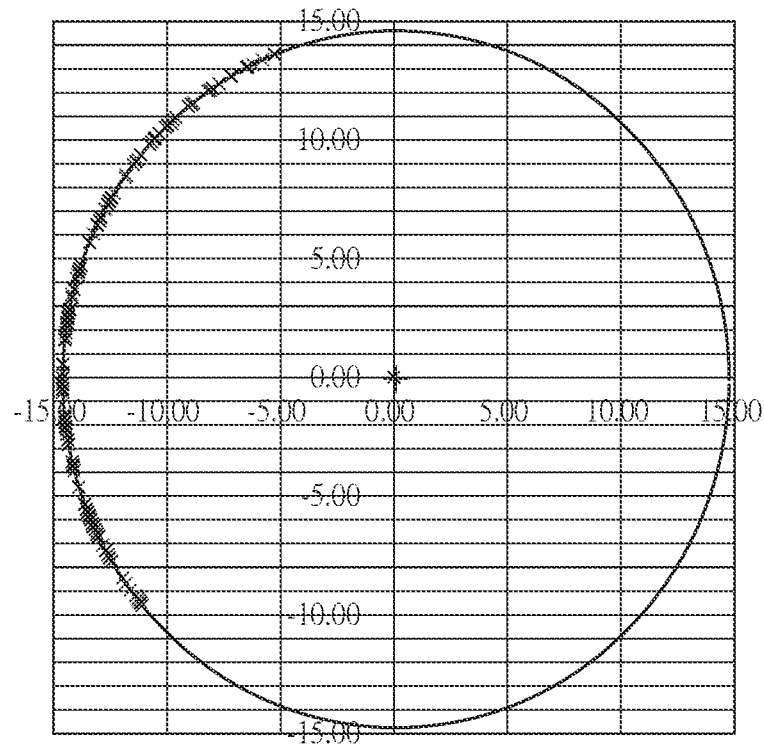
FIG. 14C is a graph of a circular curve of a third test result according to an embodiment of the present invention.
Figure 14D:
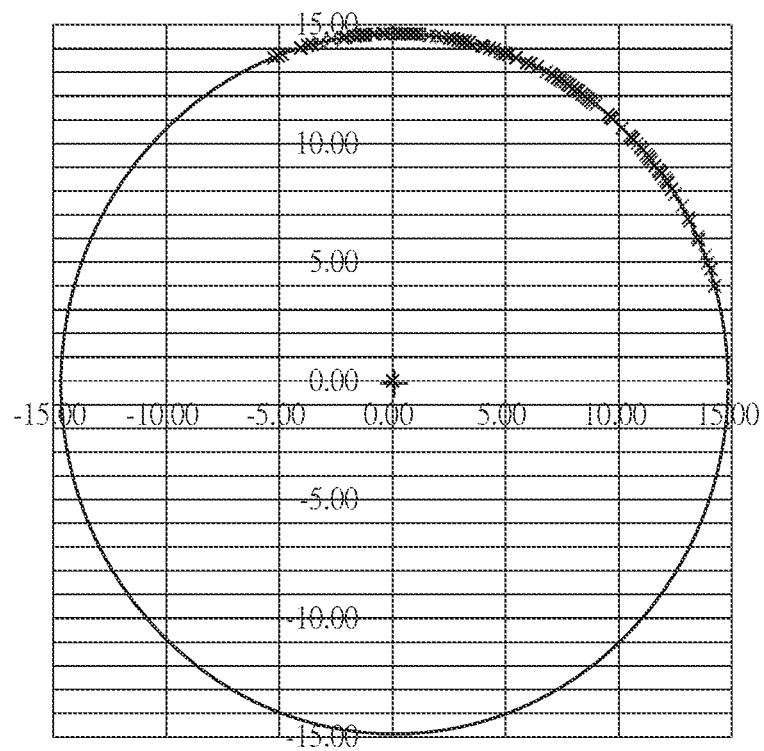
FIG. 14D is a graph of a circular curve of a fourth test result according to an embodiment of the present invention.

At this time, since the total number of pieces of contour data generated by detecting the entire contour 21 of the wafer template is already known, the controller 15 can perform different tests according to the accumulation of contour data, the acceptable error range (for example, ±0.1 mm), and the specification of the wafer template (for example, the specification of a 12-inch wafer), to estimate the data volume ratio required to calculate the position of the eccentric center within the error range. Then, the controller 15 estimates the first angle threshold according to the data volume ratio. For example, as shown in Table 1, experimental tests are performed based on the same wafer template and the detection process of steps S1 to S9 in FIG. 4A to obtain the following test results. First, set the data volume ratio of the total number of the contour data generated by detecting the entire contour 21 of the wafer template to 100%, and the angle corresponding to these pieces of contour data is 360 degrees, as shown in FIG. 13. Therefore, the first angle threshold that the entire contour 21 is measured is defined as 360 degrees. Then, different data volume ratios are used for testing to find the minimum data volume ratio required by the specification of this wafer template, and the error of the calculation result of the eccentric position can be maintained within an allowable range. For example, in a first test result based on only the data volume ratio of 35% (that is, the detector 14 only detects the area, covered by 126 degrees (360×35%=126), on the contour of the wafer template), the circular curve simulated according to the collected pieces of contour data is shown in FIG. 14A, and the error of the calculation result of the eccentric position (i.e., X-axis error and Y-axis error) is within the allowable error range (for example, ±0.1 mm). In a second test result based on the data volume ratio of 35% as the test condition, the circular curve simulated according to the collected pieces of contour data is shown in FIG. 14B, and the error of the calculation result of the eccentric position is still within the allowable error range (for example, ±0.1 mm). In a third test result based on the data volume ratio of 23.5% as the test condition, the circular curve simulated according to the collected pieces of contour data is shown in FIG. 14C, and the error of the calculation result of the eccentric position is still within the allowable error range (for example, ±0.1 mm) even though it is slightly larger than that of the first and the second test results (that is, the calculation accuracy is low). In a fourth test result based on the data volume ratio of 23.5% as the test condition, the circular curve simulated according to the collected pieces of contour data is shown in FIG. 14D, and the error of the calculation result of the eccentric position is still within the allowable error range (for example, ±0.1 mm).

TABLE 1

| Test result_# | X-axis error (mm) | Y-axis error_(mm) | Data volume ratio (%) |
|---|---|---|---|
| 1 | 0.016 | −0.007 | 35 |
| 2 | −0.009 | 0.007 | 35 |
| 3 | −0.032 | 0.009 | 23.5 |
| 4 | −0.037 | −0.038 | 23.5 |

It can be known from the above test results that: we can repeatedly test out the minimum data volume ratio within the allowable error range based on the same wafer template, and draw up different contour measurement plans based on different data volume ratios, that is, different first angle thresholds. For example, the first angle threshold of 84.96 degrees (360×23.5%=84.96) and the first angle threshold of 126 degrees (360×35%=126) are drawn up based on data volume ratios of 23.5% and 35% respectively for testers to choose. After one of the first angle thresholds is selected, when subsequently detecting each wafer 20 with the same specifications as the wafer template, the controller 15 can directly detect the contour 21 of the wafer 20 based on the setting of the first angle threshold.

In the same way, since the above-mentioned second angle threshold is related to the angle required for the aiming feature 22 of the wafer 20 to rotate from one side of the detection coverage 141 of the detector 14 to the opposite side, it is also possible to sum up the second angle threshold that allows the error of the calculation result of the eccentric position to be within the allowable error range through repeated tests on the same wafer template.

Although the above-mentioned embodiment is described by taking the first speed V1 greater than the second speed V2 as an example, the present invention is not limited to this. In other embodiments of the present invention, the first speed V1 may be substantially equal to the second rotation speed V2, and the rotation direction in the compensation scheme used to make up the data volume may be adjusted according to the design of the speed to provide more compensation schemes or more efficient compensation schemes.

In summary, the present invention is to rotate the wafer in a first direction at a first speed and meanwhile, detect the contour of the rotating wafer, then to rotate the wafer in a second direction opposite to the first direction at a second speed and meanwhile, detect the contour of the rotating wafer when the aiming feature of the rotating wafer in the first direction at the first speed passes through the detection coverage of the detector, and finally, to estimate the eccentric position of the wafer and the position of the aiming feature according to the accumulated detection results and the rotation angles of the rotating table when the aiming feature of the rotating wafer in the second direction at the second speed passes through the detection coverage of the detector. Since the wafer does not need to rotate for a full circle in either of the two rotation directions, the number of positions on the contour detected repeatedly by the detector can be reduced, so that the time required for detection can be greatly shortened, and the overall efficiency of the wafer manufacturing process can be improved. Moreover, the present invention further provides one or more compensation schemes, so that the data volume required to calculate the eccentric position of the wafer and the position of the aiming feature can be kept sufficient. In addition, the present invention further provides the data volume ratios of the data to be collected corresponding to different calculation accuracy as options for the contour measurement scheme, and no matter which option it is, the calculated deviation of the center of the wafer and the angular deviation of the aiming feature can still be maintained within an acceptable error range.

Although the present invention is disclosed as above in the foregoing embodiments, these embodiments are not intended to limit the present invention. Without departing from the spirit and scope of the present invention, all changes, modifications, and combinations of various implementation modes are within the scope of patent protection of the present invention. For the scope of protection defined by the present invention, please refer to the attached claims.

What is claimed is:

1. A method for detecting positions of wafers, comprising the following steps:
    placing the wafer on a rotating table, and a contour of the wafer including an aiming feature;
    driving, by a controller, the rotation table to rotate in a first direction at a first speed, so as to drive the wafer to rotate in the first direction at the first speed;
    detecting, by a detector, the contour of the wafer rotating in the first direction at the first speed to provide a piece of contour data, corresponding to a respective currently-detected position on the contour, to the controller;
    when the controller, according to the piece of contour data corresponding to rotation of the rotation table in the first direction at the first speed, determines that the aiming feature passes the detector in the first direction at the first speed, by the controller, driving the rotation table to rotate in a second direction at a second speed to drive the wafer to rotate in the second direction at the second speed, and the second direction being opposite to the first direction;
    detecting, by the detector, the contour of the wafer rotating in the second direction at the second speed to provide a new piece of contour data, corresponding to a respective currently-detected position on the contour, to the controller;
    when the controller, according to the piece of contour data corresponding to rotation of the wafer in the second direction at the second speed, determines that the aiming feature passes the detector in the second direction at the second speed, by the controller, stopping rotation of the rotation table and detection of the wafer to according to an accumulation of contour data and rotation angles corresponding to all the detected positions on the contour, estimate an eccentric position of the wafer and a position of the aiming feature;
    estimating, by the controller, a total measured angle of the wafer according to the accumulation of contour data and the rotation angles corresponding to all the detected positions on the contour, and the total measured angle being an angle corresponding to a detected range on the contour of the wafer;
    determining, by the controller, whether the total measured angle is greater than or equal to a first angle threshold;
    estimating a deviation of a center of the wafer and an angular deviation of the aiming feature according to the accumulation of contour data and the rotation angles corresponding to all the detected positions on the contour by the controller after the rotation of the rotation table and the detection of the wafer are stopped; and
    executing, by the controller, a first compensation scheme when the total measured angle is less than the first angle threshold, and the first compensation scheme comprising the following steps:
        driving, by the controller, the rotation table to rotate in the first direction at the first speed again, so as to drive the wafer to rotate in the first direction at the first speed again;
        detecting, by the detector, the contour of the wafer rotating in the first direction at the first speed again to provide a new piece of contour data, corresponding to a respective currently-detected position on the contour, to the controller; and
        updating, by the controller, the total measured angle according to the accumulation of contour data and the rotation angles corresponding to all the detected positions on the contour to determine whether the updated total measured angle is greater than or equal to the first angle threshold,
    wherein:
    the respective piece of contour data is related to a distance from a rotation center of the rotation table to corresponding one of the detected positions on the contour;
    when the controller, according to the contour data, determines that the aiming feature passes the detector in the second direction and the total measured angle is greater than or equal to the first angle threshold, the controller stops the rotation of the rotation table and the detection of the wafer; and
    estimating the eccentric position of the wafer according to the accumulation of contour data and the rotation angles corresponding to all the detected positions on the contour comprises the following steps:
        mapping a respective piece of contour data among the accumulation of contour data and the corresponding rotation angle into a respective piece of two-dimensional information;
        simulating a circular curve corresponding to all the detected positions on the contour of the wafer according all the pieces of two-dimensional information; and
        estimating a center of the circular curve as the eccentric position of the wafer.

2. The method for detecting the positions of the wafers as claimed in claim 1, wherein by the controller, estimating the position of the aiming feature according to the accumulation of contour data and the rotation angles corresponding to all the detected positions on the contour comprises the following steps:

defining, by the controller, a minimum piece of contour data among the accumulation of contour data as contour data of a pole of the aiming feature; and estimating, by the controller, the position of the aiming feature according to a position of the center of the circular curve and a position of the pole.

3. The method for detecting the positions of the wafers as claimed in claim 1, wherein the controller calculates a respective instantaneous variation value by calculating a differential of the respective piece of contour data, and when the controller determines that the instantaneous variation value is greater than or equal to a measurement threshold, the controller determines that the aiming feature passes the detector.

4. The method for detecting the positions of the wafers as claimed in claim 1, wherein the second speed is less than the first speed.

5. A method for detecting positions of wafers, comprising the following steps:

placing the wafer on a rotating table, and a contour of the wafer including an aiming feature;

driving, by a controller, the rotation table to rotate in a first direction at a first speed, so as to drive the wafer to rotate in the first direction at the first speed;

detecting, by a detector, the contour of the wafer rotating in the first direction at the first speed to provide a piece of contour data, corresponding to a respective currently-detected position on the contour, to the controller;

when the controller, according to the piece of contour data corresponding to rotation of the rotation table in the first direction at the first speed, determines that the aiming feature passes the detector in the first direction at the first speed, by the controller, driving the rotation table to rotate in a second direction at a second speed to drive the wafer to rotate in the second direction at the second speed, and the second direction being opposite to the first direction;

detecting, by the detector, the contour of the wafer rotating in the second direction at the second speed to provide a new piece of contour data, corresponding to a respective currently-detected position on the contour, to the controller;

when the controller, according to the piece of contour data corresponding to rotation of the wafer in the second direction at the second speed, determines that the aiming feature passes the detector in the second direction at the second speed, by the controller, stopping rotation of the rotation table and detection of the wafer to according to an accumulation of contour data and rotation angles corresponding to all the detected positions on the contour, estimate an eccentric position of the wafer and a position of the aiming feature;

estimating, by the controller, a total measured angle of the wafer according to the accumulation of contour data and the rotation angles corresponding to all the detected positions on the contour, and the total measured angle being an angle corresponding to a detected range on the contour of the wafer;

determining, by the controller, whether the total measured angle is greater than or equal to a first angle threshold;

estimating a deviation of a center of the wafer and an angular deviation of the aiming feature according to the accumulation of contour data and the rotation angles corresponding to all the detected positions on the contour by the controller after the rotation of the rotation table and the detection of the wafer are stopped; and executing, by the controller, a second compensation scheme when the total measured angle is less than the first angle threshold, and the second compensation scheme including the following steps:

driving, by the controller, the rotation table to rotate in the second direction at the first speed, so as to drive the wafer to rotate in the second direction at the first speed;

detecting, by the detector, the contour of the wafer rotating in the second direction at the first speed to provide a new piece of contour data, corresponding to a respective currently-detected position on the contour, to the controller; and updating, by the controller, the total measured angle according to the accumulation of contour data and the rotation angles corresponding to all the detected positions on the contour to determine whether the updated total measured angle is greater than or equal to the first angle threshold, wherein:

the respective piece of contour data is related to a distance from a rotation center of the rotation table to corresponding one of the detected positions on the contour;

when the controller, according to the contour data, determines that the aiming feature passes the detector in the second direction and the total measured angle is greater than or equal to the first angle threshold, the controller stops the rotation of the rotation table and the detection of the wafer; and estimating the eccentric position of the wafer according to the accumulation of contour data and the rotation angles corresponding to all the detected positions on the contour comprises the following steps:

mapping a respective piece of contour data among the accumulation of contour data and the corresponding rotation angle into a respective piece of two-dimensional information;

simulating a circular curve corresponding to all the detected positions on the contour of the wafer according all the pieces of two-dimensional information; and estimating a center of the circular curve as the eccentric position of the wafer.

6. The method for detecting the positions of the wafers as claimed in claim 5, wherein by the controller, estimating the position of the aiming feature according to the accumulation of contour data and the rotation angles corresponding to all the detected positions on the contour comprises the following steps:

defining, by the controller, a minimum piece of contour data among the accumulation of contour data as contour data of a pole of the aiming feature; and estimating, by the controller, the position of the aiming feature according to a position of the center of the circular curve and a position of the pole.

7. The method for detecting the positions of the wafers as claimed in claim 5, wherein the controller calculates a respective instantaneous variation value by calculating a differential of the respective piece of contour data, and when the controller determines that the instantaneous variation value is greater than or equal to a measurement threshold, the controller determines that the aiming feature passes the detector.

8. The method for detecting the positions of the wafers as claimed in claim 5, wherein the second speed is less than the first speed.

9. A method for detecting positions of wafers, comprising the following steps:
placing the wafer on a rotating table, and a contour of the wafer including an aiming feature;
driving, by a controller, the rotation table to rotate in a first direction at a first speed, so as to drive the wafer to rotate in the first direction at the first speed;
detecting, by a detector, the contour of the wafer rotating in the first direction at the first speed to provide a piece of contour data, corresponding to a respective currently-detected position on the contour, to the controller;
when the controller, according to the piece of contour data corresponding to rotation of the rotation table in the first direction at the first speed, determines that the aiming feature passes the detector in the first direction at the first speed, by the controller, driving the rotation table to rotate in a second direction at a second speed to drive the wafer to rotate in the second direction at the second speed, and the second direction being opposite to the first direction;
detecting, by the detector, the contour of the wafer rotating in the second direction at the second speed to provide a new piece of contour data, corresponding to a respective currently-detected position on the contour, to the controller;
when the controller, according to the piece of contour data corresponding to rotation of the wafer in the second direction at the second speed, determines that the aiming feature passes the detector in the second direction at the second speed, by the controller, stopping rotation of the rotation table and detection of the wafer to according to an accumulation of contour data and rotation angles corresponding to all the detected positions on the contour, estimate an eccentric position of the wafer and a position of the aiming feature;
estimating, by the controller, a total measured angle of the wafer according to the accumulation of contour data and the rotation angles corresponding to all the detected positions on the contour, and the total measured angle being an angle corresponding to a detected range on the contour of the wafer;
determining, by the controller, whether the total measured angle is greater than or equal to a first angle threshold;
estimating a deviation of a center of the wafer and an angular deviation of the aiming feature according to the accumulation of contour data and the rotation angles corresponding to all the detected positions on the contour by the controller after the rotation of the rotation table and the detection of the wafer are stopped; and
when the total measured angle is less than the first angle threshold, estimating, by the controller, time periods, required to execute compensation schemes respectively, according to the total measured angle and the first angle threshold; and
by the controller, deciding to execute one of the compensation schemes according to the time periods to increase the detected range on the contour of the wafer, and then updating the total measured angle, so as to determine whether the updated total measured angle is greater than or equal to the first angle threshold,
wherein:
the compensation schemes are related to a rotation direction and a speed of the rotating table;
the respective piece of contour data is related to a distance from a rotation center of the rotation table to corresponding one of the detected positions on the contour; and
when the controller, according to the contour data, determines that the aiming feature passes the detector in the second direction and the total measured angle is greater than or equal to the first angle threshold, the controller stops the rotation of the rotation table and the detection of the wafer; and
estimating the eccentric position of the wafer according to the accumulation of contour data and the rotation angles corresponding to all the detected positions on the contour comprises the following steps:
mapping a respective piece of contour data among the accumulation of contour data and the corresponding rotation angle into a respective piece of two-dimensional information;
simulating a circular curve corresponding to all the detected positions on the contour of the wafer according all the pieces of two-dimensional information; and
estimating a center of the circular curve as the eccentric position of the wafer.

10. The method for detecting the positions of the wafers as claimed in claim 9, wherein by the controller, estimating the position of the aiming feature according to the accumulation of contour data and the rotation angles corresponding to all the detected positions on the contour comprises the following steps:
defining, by the controller, a minimum piece of contour data among the accumulation of contour data as contour data of a pole of the aiming feature; and
estimating, by the controller, the position of the aiming feature according to a position of the center of the circular curve and a position of the pole.

11. The method for detecting the positions of the wafers as claimed in claim 9, wherein the controller calculates a respective instantaneous variation value by calculating a differential of the respective piece of contour data, and when the controller determines that the instantaneous variation value is greater than or equal to a measurement threshold, the controller determines that the aiming feature passes the detector.

12. The method for detecting the positions of the wafers as claimed in claim 9, wherein the second speed is less than the first speed.

* * * * *